(12) United States Patent
Zhang et al.

(10) Patent No.: US 10,043,475 B2
(45) Date of Patent: Aug. 7, 2018

(54) SHIFT REGISTER AND DRIVING METHOD THEREOF, DRIVING CIRCUIT, AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Xiaojie Zhang, Beijing (CN); Xianjie Shao, Beijing (CN); Xiaohe Li, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 160 days.

(21) Appl. No.: 15/097,760

(22) Filed: Apr. 13, 2016

(65) Prior Publication Data

US 2016/0335978 A1  Nov. 17, 2016

(30) Foreign Application Priority Data

May 12, 2015 (CN) .......................... 2015 1 0240029

(51) Int. Cl.
*G11C 19/00* (2006.01)
*G09G 3/36* (2006.01)
*G11C 19/28* (2006.01)

(52) U.S. Cl.
CPC ......... *G09G 3/3677* (2013.01); *G11C 19/287* (2013.01); *G09G 2310/0286* (2013.01); *G11C 19/28* (2013.01)

(58) Field of Classification Search
None
See application file for complete search history.

(56) References Cited

U.S. PATENT DOCUMENTS 8,014,488 B2 * 9/2011 Jang .................. G11C 19/28
377/64
2010/0245301 A1 * 9/2010 Shang ................ G09G 3/3677
345/204

(Continued)

FOREIGN PATENT DOCUMENTS

CN       102903323 A    1/2013
CN       103093825 A    5/2013

OTHER PUBLICATIONS

Chinese office action dated Sep. 26, 2017 for corresponding CN application 201510240029.1 with English translation attached.

*Primary Examiner* — Tuan T Lam
(74) *Attorney, Agent, or Firm* — Nath, Goldberg & Meyer; Joshua B. Goldberg

(57) ABSTRACT

The present invention provides a shift register and a driving method thereof, a driving circuit, and a display device, the shift register includes an input unit, an output unit and a reset unit, the input unit controls potential of a first node according to input signals of an input terminal and a first voltage terminal, the output unit controls an output signal of an output terminal according to input signals of the input terminal and a clock signal terminal under the control of the potential of the first node, and the reset unit controls potential of a second node according to input signals of a reset terminal and a second voltage terminal.

20 Claims, 3 Drawing Sheets

(56) References Cited

U.S. PATENT DOCUMENTS

| | | | |
|---|---|---|---|
| 2011/0316834 A1* | 12/2011 | Lee | G09G 3/3677 |
| | | | 345/211 |
| 2013/0108006 A1 | 5/2013 | Tobita | |
| 2014/0168050 A1* | 6/2014 | Gu | G09G 3/3611 |
| | | | 345/100 |
| 2015/0318053 A1* | 11/2015 | Zhang | G09G 3/36 |
| | | | 377/64 |
| 2015/0339999 A1* | 11/2015 | Zheng | G11C 19/28 |
| | | | 345/92 |
| 2017/0025068 A1* | 1/2017 | Jeoung | G11C 19/28 |

* cited by examiner

SHIFT REGISTER AND DRIVING METHOD THEREOF, DRIVING CIRCUIT, AND DISPLAY DEVICE

FIELD OF THE INVENTION

The present invention relates to the field of display technology, and particularly, relates to a shift register and a driving method thereof, a driving circuit and a display device.

BACKGROUND OF THE INVENTION

A driving circuit used for a thin film transistor liquid crystal display (TFT-LCD) panel mainly includes a gate driving circuit and a data driving circuit, wherein the gate driving circuit applies an inputted clock signal onto a gate line of the liquid crystal display panel after converting the clock signal by a shift register. The gate driving circuit includes multiple stages of shift registers, each being connected to a corresponding gate line to output a gate diving signal. In the prior art, the multiple stages of shift registers of the gate driving circuit are connected to each other, an initial signal is inputted into a first stage shift register, an input terminal of an Nth stage shift register is connected to an output terminal of an (N−1)th stage shift register, and an output terminal of an (N+1)th stage shift register is connected to a reset terminal of the Nth stage shift register.

FIG. 1 is a schematic structure diagram showing a shift register in the prior art. As shown in FIG. 1, the shift register includes ten transistors M1 to M10 and a first capacitor C1 which are connected in the following manner: a gate of a first transistor M1 is connected to a first electrode thereof; a second electrode of the first transistor M1 is connected to a first electrode of a second transistor M2, a gate of a third transistor M3, a gate of a sixth transistor M6, a gate of a eighth transistor M8, a first electrode of a tenth transistor M10 and a first electrode of the first capacitor C1 at an node P1; a second electrode of the first capacitor C1 is connected to a second electrode of the third transistor M3 and a first electrode of a fourth transistor M4; a gate of the fourth transistor M4 is connected to a first electrode of a fifth transistor M5 and a first electrode and a gate of a ninth transistor M9; a second electrode of the fifth transistor M5 is connected to a first electrode of the sixth transistor M6 and a gate of the tenth transistor M10 at an node P3; a second electrode of the ninth transistor M9 is connected to a gate of the fifth transistor M5 and a first electrode of the eighth transistor M8 at an node P2.

The first electrode of the first transistor M1 is connected to an input terminal G(N−1) of the shift register, the second electrode of the first capacitor C1 is connected to an output terminal G(N) of the shift register. The gate of the second transistor M2 is connected to a reset terminal G(N+1) of the shift register. The first electrode of the third transistor M3 is connected to a first clock signal terminal CLK, the first electrode of the fifth transistor M5 is connected to a second clock signal terminal CLKB. The second electrodes of the transistors M2, M4, M6, M8 and M10 are connected to a low-level input terminal VSS of the shift register.

FIG. 2 is an operation timing diagram of the shift register shown in FIG. 1. As shown in FIG. 2, DATA represents a data signal. The detailed operating principle of the shift register is known in the prior art, and is not elaborated herein. However, with increasing demands for slim bezel and high resolution of a display panel in the market, the above shift register having a complex structure and poor performance could not meet the demands.

SUMMARY OF THE INVENTION

An object of the present invention is to provide a shift register and a driving method thereof, a driving circuit having the shift register, and a display device having the driving circuit, in order to solve the problems of complex structure and low performance of the shift register in the prior art.

In view of this, the present invention provides a shift register comprising an input unit, an output unit and a reset unit, wherein the input unit is connected to an input terminal, a first voltage terminal, a first node and a second node, respectively, and used for controlling potential of the first node according to input signals of the input terminal and the first voltage terminal; the output unit is connected to an output terminal, the input terminal, the first voltage terminal, the first node and a clock signal terminal, respectively, and used for controlling, under the control of the potential of the first node, an output signal of the output terminal according to input signals of the input terminal and the clock signal terminal; the reset unit is connected to a reset terminal, the output terminal, the first node, the second node and a second voltage terminal, respectively, and used for controlling potential of the second node according to input signals of the reset terminal and the second voltage terminal.

Optionally, the input unit includes a first transistor and a ninth transistor, wherein a first electrode of the first transistor is connected to the first voltage terminal, a gate of the first transistor is connected to the input terminal, and a second electrode of the first transistor is connected to the first node; a second electrode of the ninth transistor is connected to the second node, a gate of the ninth transistor is connected to the first voltage terminal, and a first electrode of the ninth transistor is connected to the first voltage terminal.

Optionally, the output unit includes a third transistor, an eleventh transistor and a first capacitor, wherein a first electrode of the third transistor is connected to the clock signal terminal, a gate of the third transistor is connected to the first node, and a second electrode of the third transistor is connected to the output terminal; the first capacitor is connected between the gate and the second electrode of the third transistor; a first electrode of the eleventh transistor is connected to the input terminal, a gate of the eleventh transistor is connected to the first voltage terminal, and a second electrode of the eleventh transistor is connected to the output terminal.

Optionally, the reset unit includes a second transistor, a fourth transistor, a fifth transistor and a tenth transistor, wherein a first electrode of the second transistor is connected to the first node, a gate of the second transistor is connected to the reset terminal, and a second electrode of the second transistor is connected to the second voltage terminal; a first electrode of the fourth transistor is connected to the output terminal, a gate of the fourth transistor is connected to the second node, and a second electrode of the fourth transistor is connected to the second voltage terminal; a first electrode of the fifth transistor is connected to the second node, a gate of the fifth transistor is connected to the first node, and a second electrode of the fifth transistor is connected to the second voltage terminal; a first electrode of the tenth transistor is connected to the first node, a gate of the tenth transistor is connected to the second node, and a second electrode of the tenth transistor is connected to the second voltage terminal.

Optionally, all of the transistors are N-type transistors or P-type transistors.

The present invention further provides a driving method of a shift register, wherein the shift register is any one of the above shift registers, the first voltage terminal is applied with a high-level signal, the second voltage terminal is applied with a low-level signal, and the driving method includes steps of: in a first phase, inputting a high-level signal to the input terminal, inputting a low-level signal to the reset terminal, inputting a low-level signal to the clock signal terminal, and outputting a high-level signal by the output terminal; in a second phase, inputting a low-level signal to the input terminal, inputting a low-level signal to the reset terminal, inputting a high-level signal to the clock signal terminal, and outputting a high-level signal by the output terminal; in a third phase, inputting a low-level signal to the input terminal, inputting a low-level signal to the reset terminal, inputting a low-level signal to the clock signal terminal, and outputting a low-level signal by the output terminal; in a fourth phase, inputting a low-level signal to the input terminal, inputting a high-level signal to the reset terminal, inputting a high-level signal to the clock signal terminal, and outputting a low-level signal by the output terminal.

The present invention further provides a driving circuit comprising multiple stages of shift registers, wherein the shift register is any one of the above-described shift registers, and for any integer N no less than 2, the input terminal of an Nth grade shift register is connected to the output terminal of an (N−1)th stage shift register, the output terminal of the Nth stage shift register is connected to the input terminal of an (N+1)th stage shift register, and the reset terminal of the Nth stage shift register is connected to the output terminal of an (N+2)th stage shift register.

Optionally, the driving circuit further includes a first clock signal line and a second clock signal line, the clock signal terminal of the Nth stage shift register is connected to the first clock signal line, and the clock signal terminal of the (N−1)th stage shift register is connected to the second clock signal line.

The present invention further provides a display device including any one of the above driving circuits.

The beneficial effects of the present invention are as follows.

In the shift register and the driving method thereof, the driving circuit, and the display device provided by the present invention, the shift register includes the input unit, the output unit and the reset unit, the input unit controls the potential of the first node according to the input signals of the input terminal and the first voltage terminal, the output unit controls the output signal of the output terminal according to the input signals of the input terminal and the clock signal terminal under the control of the potential of the first node, and the reset unit controls the potential of the second node according to input signals of the reset terminal and the second voltage terminal. In the technical solution provided by the present invention, the complex circuit structure of the shift register in the prior art is simplified, and the area of the shift register is reduced, which facilitates slimming the bezel of a liquid crystal display panel including the shift register. In addition, in a display panel including the shift register, a gate diving signal of each row is outputted one row ahead of schedule, which eliminates signal delay due to resistance of the gate line itself and load capacitance thereof, so that write-in time for a corresponding pixel voltage is increased, and stability of the display panel is improved.

DETAILED DESCRIPTION OF THE EMBODIMENTS

To provide better understanding of the technical solution of the present invention for those skilled in the art, a shift register and a driving method thereof, a driving circuit, and a display device provided by the present invention will be described in detail below with reference to the accompanying drawings.

First Embodiment

Figure 1:
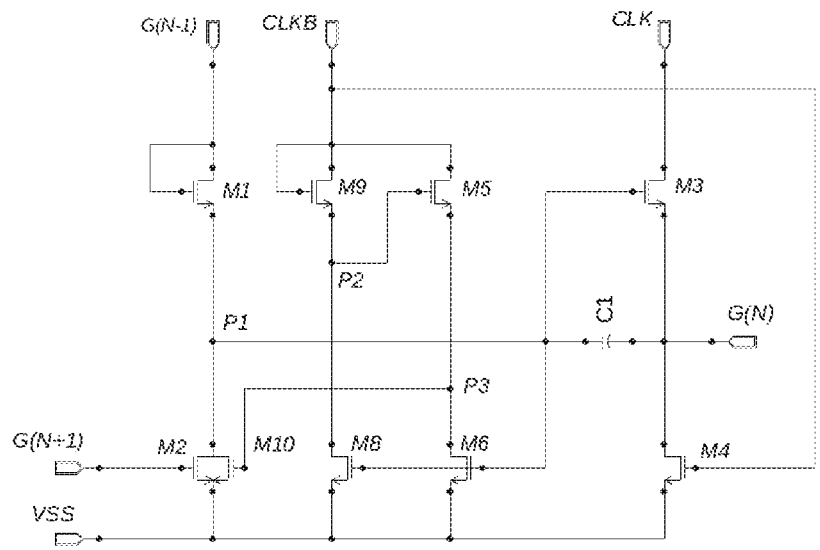
FIG. 1 is a schematic structure diagram of a shift register in the prior art.
Figure 2:
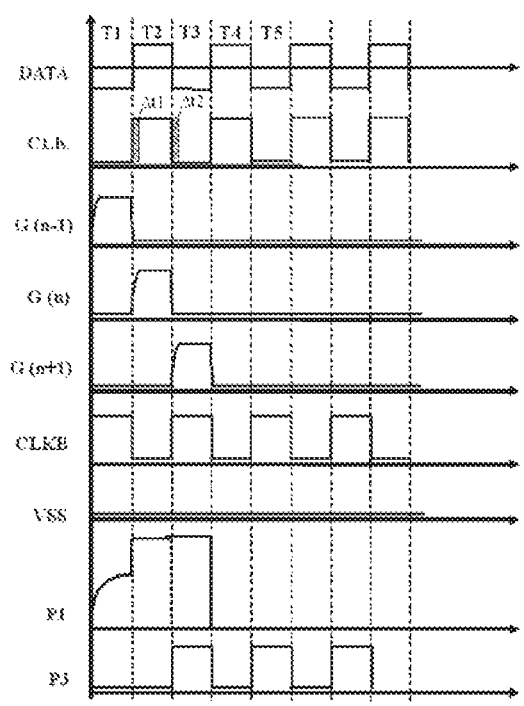
FIG. 2 is an operation timing diagram of the shift register shown in FIG. 1.
Figure 3:
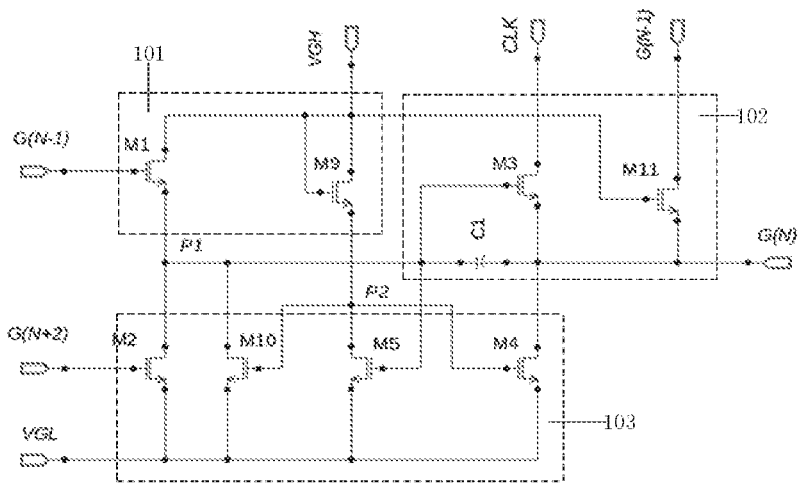
FIG. 3 is a schematic structure diagram of a shift register provided by a first embodiment of the present invention.

FIG. 3 is a schematic structure diagram of a shift register provided by the first embodiment of the present invention. As shown in FIG. 3, the shift register includes an input unit 101, an output unit 102 and a reset unit 103. The input unit 101 is connected to an input terminal G(N−1), a first voltage terminal VGH, a first node P1, and a second node P2, respectively, and the input unit 101 is used for controlling potential of the first node P1 according to input signals of the input terminal G(N−1) and the first voltage terminal VGH. The output unit 102 is connected to an output terminal G(N), the input terminal G(N−1), the first voltage terminal VGH, the first node P1 and a clock signal terminal CLK, respectively, and the output unit 102 is used for controlling an output signal of the output terminal G(N) according to input signals of the input terminal G(N−1) and the clock signal terminal CLK under the control of the potential of the first node P1. The reset unit 103 is connected to a reset terminal G(N+2), the output terminal G(N), the first node P1, the second node P2, and a second voltage terminal VGL, respectively, and the reset unit 103 is used for controlling potential of the second node P2 according to input signals of the reset terminal G(N+2) and the second voltage terminal VGL. In the technical solution provided by the present embodiment, the complex circuit structure of the shift register in the prior art is simplified, and the area of the shift register is reduced, which facilitates slimming the bezel of a liquid crystal display panel including the shift register.

Hereinafter, the specific structures of the input unit 101, the output unit 102 and the reset unit 103 will be described in detail. The input unit 101 includes a first transistor M1 and a ninth transistor M9. A first electrode of the first transistor M1 is connected to the first voltage terminal a gate of the first transistor M1 is connected to the input terminal G(N−1), and a second electrode of the first transistor M1 is connected to the first node P1. A second electrode of the ninth transistor M9 is connected to the second node P2, a gate of the ninth transistor M9 is connected to the first voltage terminal VGH, and a first electrode of the ninth transistor M9 is connected to the first voltage terminal VGH.

In the present embodiment, the output unit 102 includes a third transistor M3, an eleventh transistor M11 and a first capacitor C1. A first electrode of the third transistor M3 is connected to the clock signal terminal CLK, a gate of the third transistor M3 is connected to the first node P1, and a second electrode of the third transistor M3 is connected to the output terminal G(N). The first capacitor C1 is connected between the gate and the second electrode of the third transistor M3. A first electrode of the eleventh transistor M11 is connected to the input terminal G(N−1), a gate of the eleventh transistor M11 is connected to the first voltage terminal VGH, and a second electrode of the eleventh transistor M11 is connected to the output terminal G(N).

Referring to FIG. 3, the reset unit 103 includes a second transistor M2, a fourth transistor M4, a fifth transistor M5, and a tenth transistor M10. A first electrode of the second transistor M2 is connected to the first node P1, a gate of the second transistor M2 is connected to the reset terminal G(N+2), and a second electrode of the second transistor M2 is connected to the second voltage terminal VGL. A first electrode of the fourth transistor M4 is connected to the output terminal G(N), a gate of the fourth transistor M4 is connected to the second node P2, and a second electrode of the fourth transistor M4 is connected to the second voltage terminal VGL. A first electrode of the fifth transistor M5 is connected to the second node P2, a gate of the fifth transistor M5 is connected to the first node P1, and a second electrode of the fifth transistor M5 is connected to the second voltage terminal VGL, A first electrode of the tenth transistor M10 is connected to the first node P1, a gate of the tenth transistor M10 is connected to the second node P2, and a second electrode of the tenth transistor M10 is connected to the second voltage terminal VGL.

It should be noted that all of the transistors provided by the present embodiment are N-type transistors, but an implementation adopting P-type transistors also falls into the protection scope of the present invention.

The shift register provided by the present embodiment includes the input unit, the output unit and the reset unit, the input unit controls the potential of the first node according to the input signals of the input terminal and the first voltage terminal, the output unit controls the output signal of the output terminal according to the input signals of the input terminal and the clock signal terminal under the control of the potential of the first node, and the reset unit controls the potential of the second node according to the input signals of the reset terminal and the second voltage terminal. In the technical solution provided by the present embodiment, the complex circuit structure of the shift register in the prior art is simplified, the area of the shift register is reduced, which facilitates slimming the bezel of a liquid crystal display panel including the shift register.

In addition, as compared with the shift register in the prior art, the shift register of the embodiment of the present invention adopts the first voltage terminal VGH (a direct-current signal input terminal) instead of a second clock signal terminal CLKB (an anti-clock signal input terminal), adds the eleventh transistor M11, and changes the reset terminal G(n+1) into G(n+2) to defer the reset signal, so that the output signal of the shift register is ahead of schedule and the durations thereof is doubled. As such, in the display panel having the shift register, a gate diving signal of each row is outputted one row ahead of schedule, which eliminates signal delay due to resistance of the gate line itself and load capacitance thereon, so that write-in time for a corresponding pixel voltage is increased, and stability of the display panel is improved.

Second Embodiment

Figure 4:
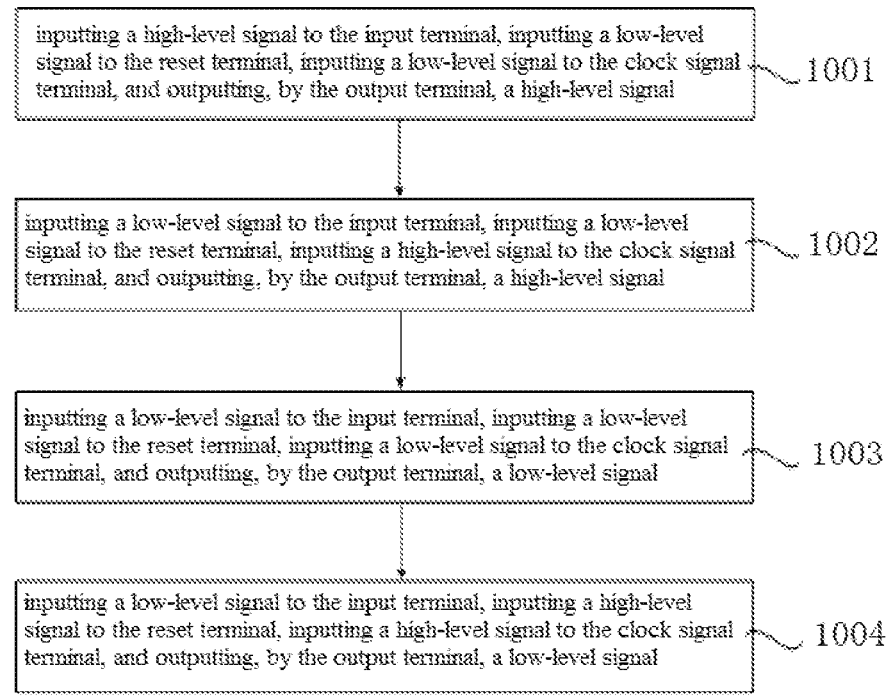
FIG. 4 is a flowchart of a driving method of a shift register provided by a second embodiment of the present invention.

FIG. 4 is a flowchart of a driving method of a shift register provided by a second embodiment of the present invention. As shown in FIG. 4, the shift register includes the shift register provided by the first embodiment, the first voltage terminal VGH is provided with a high-level signal, the second voltage terminal VGL is provided with a low-level signal, and the high-level signal of the first voltage terminal VGH and the low-level signal of the second voltage terminal VGL are direct-current signals. The driving method includes the following steps 1001 to 1004.

In step 1001, a high-level signal is inputted to the input terminal, a low-level signal is inputted to the reset terminal, a low-level signal is inputted to the clock signal terminal, and the output terminal outputs a high-level signal.

Figure 5:
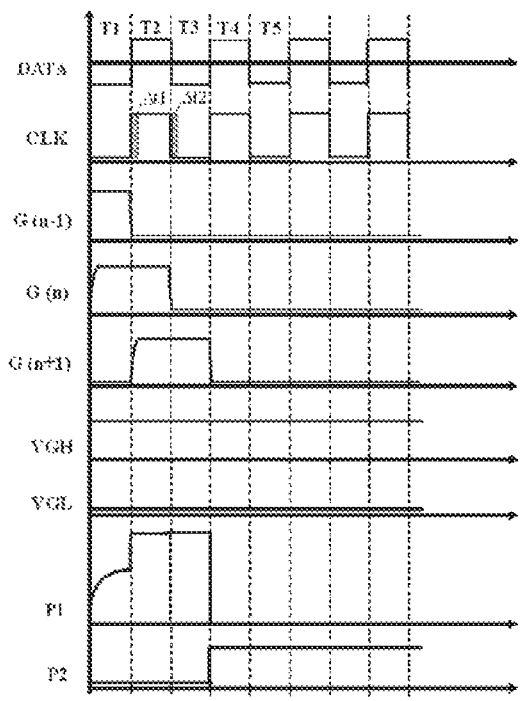
FIG. 5 is an operation timing diagram of the shift register in the second embodiment of the present invention.

FIG. 5 is an operation timing diagram of the shift register in the second embodiment of the present invention. As shown in FIG. 5, in a first phase T1, the input terminal G(N−1) is at a high level, the reset terminal G(N+2) is at a low level, the clock signal terminal CLK is at a low level, the output terminal G(N) is at a high level. At this time, the first transistor M1 is turned on, the high level at the first voltage terminal VGH charges the first capacitor C1 to cause the first node P1 to be at a high potential, the third transistor M3 is turned on, and since the eleventh transistor M11 is turned on at this time, the output terminal G(N) outputs a high-level signal. The fifth transistor M5 is turned on, the low level at the second voltage terminal VGL causes the second node P2 to be at a low potential, and the tenth transistor M10, the fourth transistor M4 and the second transistor M2 are turned off, so as to ensure normal output of the output terminal G(N).

In step 1002, a low-level signal is inputted to the input terminal, a low-level signal is inputted to the reset terminal, a high-level signal is inputted to the clock signal terminal, and the output terminal outputs a high-level signal.

In a second phase T2, the input terminal G(N−1) is at a low level, the reset terminal G(N+2) is at a low level, the clock signal terminal CLK is at a high level, and the output terminal G(N) outputs a high-level signal. At this time, the first transistor M1 and the eleventh transistor M11 are turned off, the third transistor M3 is turned on and outputs a high-level signal through the output terminal G(N). The first node P1 remains at the high potential, the fifth transistor M5 is turned on, the second node P2 is at a low potential, and the tenth transistor M10, the fourth transistor M4, and the second transistor M2 are turned off, so as to ensure normal output of the output terminal G(N).

In step 1003, a low-level signal is inputted to the input terminal, a low-level signal is inputted to the reset terminal, a low-level signal is inputted to the clock signal terminal, and the output terminal outputs a low-level signal.

In a third phase T3, the input terminal G(N−1) is at a low level, the reset terminal G(N+2) is at a low level, the clock signal terminal CLK is at a low level, and the output terminal G(N) outputs a low-level signal. At this time, the eleventh transistor M11 is turned off, the third transistor M3 is turned on, and since the clock signal CLK and the input signal G(N−1) are at low level, the output terminal G(N) outputs a low-level signal. The first node P1 remains at the high potential, the fifth transistor M5 is turned on, the second node P2 at a low potential, and the tenth transistor M10, fourth transistor M4 and the second transistor M2 are turned off, so as to ensure normal output of the output terminal G(N).

In step 1004, a low-level signal is inputted to the input terminal, a high-level signal is inputted to the reset terminal, a high-level signal is inputted to the clock signal terminal, and the output terminal outputs a low-level signal.

In a fourth phase T4, the input terminal G(N−1) is at a low level, the reset terminal G(N−2) is at a high level, the clock signal terminal CLK is at a high level, and the output terminal G(N) outputs a low-level signal. At this time, the first transistor M1 is turned off, the eleventh transistor M11 is turned off, the second transistor M2 is turned on, and the low level at the second voltage terminal VGL discharges the first capacitor C1 and the output terminal G(N), so that the first node P1 is at a low potential. The fifth transistor M5 is turned off, the high level at the first voltage terminal VGH causes the second node P2 to be at a high potential, the fourth transistor M4 and the tenth transistor M10 are turned on, and remove noise from the first node P1 and the output terminal G(N). At this time, the third transistor M3 is turned off, and the output terminal G(N) outputs a low-level signal.

In the fourth phase T4, the potential of the first node P1 becomes a low potential due to that the second transistor M2 is turned on, at this point, the fifth transistor M5 is turned off, the potential of the second node P2 becomes a high potential, and the fourth transistor M4 and the tenth transistor M10 are turned on and remove noise from the first node P1 and the output terminal G(N).

It can be seen that, in a case where multiple stages of shift registers, each being the shift register of the first embodiment, are cascaded, in the second phase T2, the output terminal G(N) of an Nth stage shift register and the output terminal G(N+1) of an (N+1)th stage shift register both are at high level, and in a display panel including the multiple stages of shift registers, the pixel voltage is written into pixels corresponding to the Nth stage shift register and the (N+1)th stage shift register simultaneously. In the third phase T3, since the output terminal G(N) of the Nth stage shift register is at a low level, the pixel corresponding to the Nth stage shift register reserves the pixel voltage written in the second phase T2 when the output terminal G(N) of the Nth stage shift register is at a low level. The output terminal G(N+1) of the (N+1)th stage shift register remains at a high level in the third phase T3, thus the pixel corresponding to the (N+1)th stage shift register does not reserve the pixel voltage written in the second phase T2, but reserves the pixel voltage written in the third phase T3. In addition, although the some pixel voltage is written into pixels corresponding to the Nth stage shift register and the (N+1)th stage shift register in the second phase T2, display time in such way is very short as compared with time for displaying one image frame, and cannot be perceived by human naked eyes, and therefore, simultaneous outputs of the Nth stage shift register and the (N+1)th stage shift register in the second phase T2 will not influence display effect.

If a clock cycle is set to be 2 T, duration of an output signal of every stage of shift register can be increased from of the prior art to 2 T (which is influenced by Δt1 and Δt2), in the embodiments of the present invention, that is, the duration of the output signal is doubled. Meanwhile, arrival time of the output signal of every stage of shift register is advanced by T in the embodiments of the present invention. Therefore, in the display panel including the shift register of the first embodiment, in the duration of the output signal of the shift register, write-in time for the corresponding pixel voltage is increased greatly, so that probability of occurring display malfunction is reduced, and stability of the display panel is improved.

In the driving method of a shift register provided by the present embodiment, the shift register includes the input unit, the output unit and the reset unit, the input unit controls the potential of the first node according to the input signals of the input terminal and the first voltage terminal, the output unit controls the output signal of the output terminal according to the input signals of the input terminal and the clock signal terminal under the control of the potential of the first node, and the reset unit controls the potential of the second node according to the input signals of the reset terminal and the second voltage terminal. In the technical solution provided by the present embodiment, the complex circuit structure of the shift register in the prior art is simplified, and the area of the shift register is reduced, which facilitates slimming the bezel of a liquid crystal display panel including the shift register. In addition, in the display panel including the shift register, a gate diving signal of each row is outputted one row ahead of schedule, which eliminates signal delay due to resistance of the gate line itself and load capacitance thereof, so that write-in time for a corresponding pixel voltage is increased, and stability of the display panel is improved.

Third Embodiment

Figure 6:
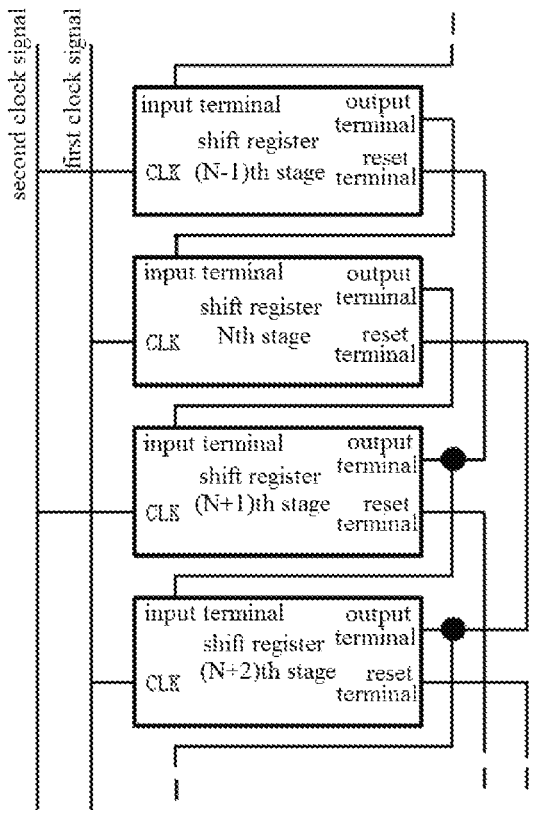
FIG. 6 is a schematic structure diagram of a driving circuit provided by a third embodiment of the present invention.

FIG. 6 is a schematic structure diagram of a driving circuit according to a third embodiment of the present invention. As shown in FIG. 6, the driving circuit includes multiple stages of shift registers, each being the shift register provided by the first embodiment, the detailed content regarding the shift register may refer to the description in the above first embodiment, and therefore will be omitted herein.

In the present embodiment, for any integer N no less than 2, the input terminal G(N−1) of an Nth stage shift register is connected to the output terminal G(N−1) of an (N−1)th stage shift register, the output terminal G(N) of the Nth stage shift register is connected to the input terminal G(N) of an (N+1)th stage shift register, and the reset terminal G(N+2) of the Nth stage shift register is connected to the output terminal G(N+2) of an (N+2)th stage shift register. Optionally, the driving circuit further includes a first clock signal line and a second clock signal line, the clock signal terminal CLK of the Nth stage shift register is connected to the first clock signal line, and the clock signal terminal CLK of the (N−1)th stage shift register is connected to the second clock signal line.

In the driving circuit provided by the present embodiment, the shift register includes the input unit, the output unit and the reset unit, the input unit controls the potential of the first node according to the input signals of the input terminal and the first voltage terminal, the output unit controls the output signal of the output terminal according to the input signals of the input terminal and the clock signal terminal under the control of the potential of the first node, and the reset unit controls the potential of the second node according to the input signals of the reset terminal and the second voltage terminal. In the technical solution provided by the present embodiment, the complex circuit structure of the shift register in the prior art is simplified, and the area of the shift register is reduced, which facilitates slimming the bezel of a liquid crystal display panel including the shift register.

In addition, since the driving circuit according to the embodiment of the present invention adopts the shift register of the first embodiment, in a display panel including the driving circuit, a gate diving signal of each row is outputted one row ahead of schedule, which eliminates signal delay due to resistance of the gate line itself and load capacitance thereof, so that write-in phase for a corresponding pixel voltage is increased, and stability of the display panel is improved.

Fourth Embodiment

The present embodiment provides a display device including the driving circuit provided by the third embodiment, the detailed content thereof may refer to the description of the above third embodiment, and therefore will be omitted herein.

In the display device provided by the present embodiment, the shift register include the input unit, the output unit and the reset unit, the input unit controls the potential of the first node according to the input signals of the input terminal and the first voltage terminal, the output unit controls the output signal of the output terminal according to the input signals of the input terminal and the clock signal terminal under the control of the potential of the first node, and the reset unit controls the potential of the second node according to the input signals of the reset terminal and the second voltage terminal. In the technical solution provided by the present embodiment, the complex circuit structure of the shift register in the prior art is simplified, and the area of the shift register is reduced, which facilitates slimming the bezel of a liquid crystal display panel including the shift register.

In addition, since the display device according to the embodiment of the present invention includes the shift register of the first embodiment, in a display panel of the display device, a gate diving signal of each row is outputted one row ahead of schedule, which eliminates signal delay due to resistance of the gate line itself and load capacitance thereof, so that write-in time for a corresponding pixel voltage is increased, and stability of the display panel is improved.

It could be understood that the above embodiments are exemplary embodiments used for describing the principle of the present invention only, but the present invention is not limited thereto. For those skilled in the art, various variations and modifications may be made without departing from the spirit and substance of the present invention, and these variations and modifications are considered as falling into the protection scope of the present invention.

The invention claimed is:

1. A shift register, comprising an input unit, an output unit and a reset unit, wherein:
the input unit is connected to an input terminal, a first voltage terminal, a first node and a second node, respectively, and is used for controlling potential of the first node according to input signals of the input terminal and the first voltage terminal;
the output unit is connected to an output terminal, the input terminal, the first voltage terminal, the first node and a clock signal terminal, respectively, and is used for controlling an output signal of the output terminal according to input signals of the input terminal and the clock signal terminal under the control of the potential of the first node; and
the reset unit is connected to a reset terminal, the output terminal, the first node, the second node and a second voltage terminal, respectively, and is used for controlling potential of the second node according input signals of the reset terminal and the second voltage terminal, wherein the input unit comprises a first transistor and a ninth transistor,
a first electrode of the first transistor is connected to the first voltage terminal, a gate of the first transistor is connected to the input terminal, and a second electrode of the first transistor is connected to the first node; and
a second electrode of the ninth transistor is connected to the second node, a gate of the ninth transistor is connected to the first voltage terminal, and a first electrode of the ninth transistor is connected to the first voltage terminal.

2. The shift register according to claim 1, wherein all of the transistors are N-type transistors or P-type transistors.

3. A driving method of a shift register, wherein the shift register is the shift register according to claim 1, the first voltage terminal is applied with a high-level signal, the second voltage terminal is applied with a low-level signal, and the driving method comprises steps of:
in a first phase, inputting a high-level signal to the input terminal, inputting a low-level signal to the reset terminal, inputting a low-level signal to the clock signal terminal, and outputting, by the output terminal, a high-level signal;
in a second phase, inputting a low-level signal to the input terminal, inputting a low-level signal to the reset terminal, inputting a high-level signal to the clock signal terminal, and outputting, by the output terminal, a high-level signal;
in a third phase, inputting a low-level signal to the input terminal, inputting a low-level signal to the reset terminal, inputting a low-level signal to the clock signal terminal, and outputting, by the output terminal, a low-level signal; and
in a fourth phase, inputting a low-level signal to the input terminal, inputting a high-level signal to the reset terminal, inputting a high-level signal to the clock signal terminal, and outputting, by the output terminal, a low-level signal.

4. A driving circuit, comprising multiple stages of shift registers, each being the shift register according to claim 1, wherein for any integer N no less than 2, the input terminal of an Nth stage shift register is connected to the output terminal of an (N−1)th stage shift register, the output terminal of the Nth stage shift register is connected to an input terminal of an (N+1)th stage shift register, and the reset terminal of the Nth stage shift register is connected to the output terminal of an (N+2)th stage shift register.

5. The driving circuit according to claim 4, further comprising a first clock signal line and a second clock signal line, wherein the clock signal terminal of the Nth stage shift register is connected to the first clock signal line, and the clock signal terminal of the N−1th stage shift register is connected to the second clock signal line.

6. A display device, comprising the driving circuit according to claim 4.

7. A display device, comprising the driving circuit according to claim 5.

8. A shift register, comprising an input unit, an output unit and a reset unit, wherein:
the input unit is connected to an input terminal, a first voltage terminal, a first node and a second node, respectively, and is used for controlling potential of the first node according to input signals of the input terminal and the first voltage terminal;
the output unit is connected to an output terminal, the input terminal, the first voltage terminal, the first node and a clock signal terminal, respectively, and is used for controlling an output signal of the output terminal according to input signals of the input terminal and the clock signal terminal under the control of the potential of the first node; and the reset unit is connected to a reset terminal, the output terminal, the first node, the second node and a second voltage terminal, respectively, and is used for controlling potential of the second node according input signals of the reset terminal and the second voltage terminal, wherein the output unit comprises a third transistor, an eleventh transistor and a first capacitor;

a first electrode of the third transistor is connected to the clock signal terminal, a gate of the third transistor is connected to the first node, and a second electrode of the third transistor is connected to the output terminal;

the first capacitor is connected between the gate and the second electrode of the third transistor; and a first electrode of the eleventh transistor is connected to the input terminal, a gate of the eleventh transistor is connected to the first voltage terminal, and a second electrode of the eleventh transistor is connected to the output terminal.

9. The shift register according to claim 8, wherein all of the transistors are N-type transistors or P-type transistors.

10. A driving method of a shift register, wherein the shift register is the shift register according to claim 8, the first voltage terminal is applied with a high-level signal, the second voltage terminal is applied with a low-level signal, and the driving method comprises steps of:

in a first phase, inputting a high-level signal to the input terminal, inputting a low-level signal to the reset terminal, inputting a low-level signal to the clock signal terminal, and outputting, by the output terminal, a high-level signal;

in a second phase, inputting a low-level signal to the input terminal, inputting a low-level signal to the reset terminal, inputting a high-level signal to the clock signal terminal, and outputting, by the output terminal, a high-level signal;

in a third phase, inputting a low-level signal to the input terminal, inputting a low-level signal to the reset terminal, inputting a low-level signal to the clock signal terminal, and outputting, by the output terminal, a low-level signal; and in a fourth phase, inputting a low-level signal to the input terminal, inputting a high-level signal to the reset terminal, inputting a high-level signal to the clock signal terminal, and outputting, by the output terminal, a low-level signal.

11. A driving circuit, comprising multiple stages of shift registers, each being the shift register according to claim 8, wherein for any integer N no less than 2, the input terminal of an Nth stage shift register is connected to the output terminal of an (N−1)th stage shift register, the output terminal of the Nth stage shift register is connected to an input terminal of an (N+1)th stage shift register, and the reset terminal of the Nth stage shift register is connected to the output terminal of an (N+2)th stage shift register.

12. The driving circuit according to claim 11, further comprising a first clock signal line and a second clock signal line, wherein the clock signal terminal of the Nth stage shift register is connected to the first clock signal line, and the clock signal terminal of the N−1th stage shift register is connected to the second clock signal line.

13. A display device, comprising the driving circuit according to claim 11.

14. A display device, comprising the driving circuit according to claim 12.

15. A shift register, comprising an input unit, an output unit and a reset unit, wherein:

the input unit is connected to an input terminal, a first voltage terminal, a first node and a second node, respectively, and is used for controlling potential of the first node according to input signals of the input terminal and the first voltage terminal;

the output unit is connected to an output terminal, the input terminal, the first voltage terminal, the first node and a clock signal terminal, respectively, and is used for controlling an output signal of the output terminal according to input signals of the input terminal and the clock signal terminal under the control of the potential of the first node; and the reset unit is connected to a reset terminal, the output terminal, the first node, the second node and a second voltage terminal, respectively, and is used for controlling potential of the second node according input signals of the reset terminal and the second voltage terminal, wherein the reset unit comprises a second transistor, a fourth transistor, a fifth transistor and a tenth transistor;

a first electrode of the second transistor is connected to the first node, a gate of the second transistor is connected to the reset terminal, and a second electrode of the second transistor is connected to the second voltage terminal;

a first electrode of the fourth transistor is connected to the output terminal, a gate of the fourth transistor is connected to the second node, and a second electrode of the fourth transistor is connected to the second voltage terminal;

a first electrode of the fifth transistor is connected to the second node, a gate of the fifth transistor is connected to the first node, and a second electrode of the fifth transistor is connected to the second voltage terminal; and a first electrode of the tenth transistor is connected to the first node, a gate of the tenth transistor is connected to the second node, and a second electrode of the tenth transistor is connected to the second voltage terminal.

16. A driving method of a shift register, wherein the shift register is the shift register according to claim 15, the first voltage terminal is applied with a high-level signal, the second voltage terminal is applied with a low-level signal, and the driving method comprises steps of:

in a first phase, inputting a high-level signal to the input terminal, inputting a low-level signal to the reset terminal, inputting a low-level signal to the clock signal terminal, and outputting, by the output terminal, a high-level signal;

in a second phase, inputting a low-level signal to the input terminal, inputting a low-level signal to the reset terminal, inputting a high-level signal to the clock signal terminal, and outputting, by the output terminal, a high-level signal;

in a third phase, inputting a low-level signal to the input terminal, inputting a low-level signal to the reset terminal, inputting a low-level signal to the clock signal terminal, and outputting, by the output terminal, a low-level signal; and in a fourth phase, inputting a low-level signal to the input terminal, inputting a high-level signal to the reset terminal, inputting a high-level signal to the clock signal terminal, and outputting, by the output terminal, a low-level signal.

17. A driving circuit, comprising multiple stages of shift registers, each being the shift register according to claim 4, wherein for any integer N no less than 2, the input terminal of an Nth stage shift register is connected to the output terminal of an (N−1)th stage shift register, the output terminal of the Nth stage shift register is connected to an input terminal of an (N+1)th stage shift register, and the reset terminal of the Nth stage shift register is connected to the output terminal of an (N+2)th stage shift register.

18. The driving circuit according to claim 17, further comprising a first clock signal line and a second clock signal line, wherein the clock signal terminal of the Nth stage shift register is connected to the first clock signal line, and the clock signal terminal of the N−1th stage shift register is connected to the second clock signal line.

19. A display device, comprising the driving circuit according to claim 17.

20. A display device, comprising the driving circuit according to claim 18.

* * * * *